(12) United States Patent
Park et al.

(10) Patent No.: US 8,037,584 B2
(45) Date of Patent: Oct. 18, 2011

(54) PRINTED CIRCUIT BOARD, METHOD OF MANUFACTURING THE SAME, AND APPARATUS FOR PERFORATING VIA HOLES

(75) Inventors: Kwang-Soo Park, Busan (KR); Sim-Hwan Park, Busan (KR); Jeong-Yeon Jeong, Busan (KR); Dae-Jung Byun, Busan (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1013 days.

(21) Appl. No.: 11/979,833

(22) Filed: Nov. 8, 2007

(65) Prior Publication Data

US 2008/0257593 A1  Oct. 23, 2008

(30) Foreign Application Priority Data

Apr. 23, 2007 (KR) .................. 10-2007-0039320

(51) Int. Cl.
  *B23Q 1/54* (2006.01)
  *B23Q 3/157* (2006.01)
  *B23B 39/02* (2006.01)
(52) U.S. Cl. ........................ 29/26 R; 29/26 A
(58) Field of Classification Search .................. 174/255; 29/26 A, 26 R
See application file for complete search history.

(56) References Cited

U.S. PATENT DOCUMENTS

| 7,220,921 B1 * | 5/2007 | Sakamoto et al. ............ 174/261 |
| 2006/0082958 A1 * | 4/2006 | Fujiwara ...................... 361/681 |

FOREIGN PATENT DOCUMENTS

| CN | 1281629 A | 1/2001 |
| CN | 2634501 Y | 8/2004 |
| JP | 11-233950 | 8/1999 |
| JP | 2003-340587 | 12/2003 |
| JP | 2005-142190 | 6/2005 |
| JP | 2005-333050 | 12/2005 |
| JP | 3799091 | 4/2006 |
| KR | 2001-0060307 | 7/2001 |
| KR | 10-2006-0069756 | 6/2006 |

OTHER PUBLICATIONS

Machine Translation of JP 1999-233950, Aug. 27, 1999.*
English Translation of Korean Office Action for corresponding Korean Patent Application No. 10-2007-0039320 dated Feb. 21, 2008.
Chinese Office Action issued Oct. 18, 2010 in corresponding Chinese Patent Application 2007101513141.9.

* cited by examiner

*Primary Examiner* — Jeremy Norris

(57) ABSTRACT

A printed circuit board, a method of manufacturing the printed circuit board, and an apparatus for perforating via holes are disclosed. By use of a method of manufacturing a printed circuit board that includes forming a first circuit pattern, which includes a reference mark and a via land, on one surface of an insulation substrate; stacking a metal layer on the insulation layer; opening a first window in the metal layer in correspondence with the reference mark; and forming a via which electrically connects the via land with the metal layer, by irradiating light towards the other surface of the insulation substrate and identifying the reference mark through the first window, the occurrence of short-circuiting is prevented in forming vias for electrical interconnection between circuit patterns in a printed circuit board, and as the defect rate caused by eccentricity between insulation layers may be reduced, aspects of the invention may contribute to reducing costs.

6 Claims, 16 Drawing Sheets

PRIOR ART

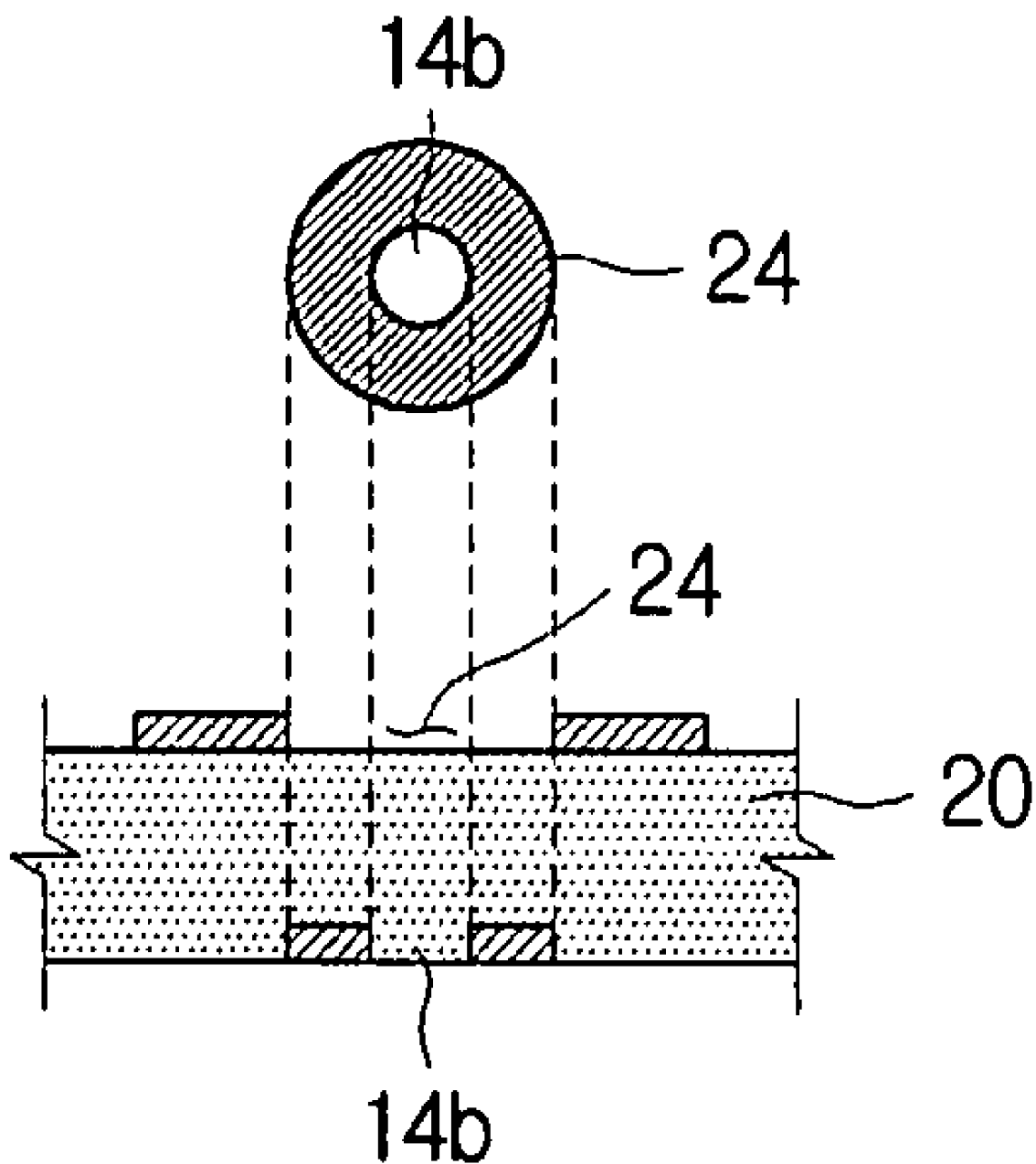

PRINTED CIRCUIT BOARD, METHOD OF MANUFACTURING THE SAME, AND APPARATUS FOR PERFORATING VIA HOLES

CROSS-REFERENCE TO RELATED APPLICATIONS

This application claims the benefit of Korean Patent Application No. 10-2007-0039320 filed with the Korean Intellectual Property Office on Apr. 23, 2007, the disclosure of which is incorporated herein by reference in its entirety.

BACKGROUND

1. Technical Field

The invention relates to a printed circuit board, a method of manufacturing the printed circuit board, and an apparatus for perforating via holes.

2. Description of the Related Art

With developments in the electronics industry, electronic parts, including cell phones, have become smaller and have provided more functionality, which has led to an increasing demand for smaller and denser printed circuit boards having finer patterns. In step with this trend towards denser printed circuit boards having finer patterns, the diameters of vias used for interlayer connection in a printed circuit board are also becoming finer, entailing greater levels of precision.

To implement interlayer connection in a printed circuit board using micro vias, precision alignment is required between an upper and lower layer, with low relative eccentricity between the upper and lower layers.

FIG. 1 is a cross-sectional view of a printed circuit board according to prior art, and FIG. 2 is a cross-sectional view of a via formed according to prior art. In FIGS. 1 and 2 are illustrated an insulation substrate 102, an insulation layer 104, circuit patterns 106, a reference mark 108, a via land 110, a copper foil layer 112, a window 114 for forming the via hole, and a via hole 116.

A method of manufacturing a printed circuit board according to prior art includes first forming a circuit pattern 106 on the lower surface of an insulation substrate 102, forming a circuit pattern 106, including via-lands 110, on the upper surface of the insulation substrate 102, and then stacking an insulation layer 104 on the upper surface of the insulation substrate 102 and stacking a copper foil layer 112 on top.

When the copper foil layer 112 has been stacked, it is selectively etched to form a reference mark 108. After determining the opening position of the window 114 for forming the via hole based on the reference mark 108 and opening the window 114 accordingly, the via hole 116 is formed from the window 114. Then, plating is performed in the via hole 116 to form a via 103.

When the via 103 has been formed, the copper foil layer 112 is selectively etched to form a circuit pattern 106 on the upper surface of the insulation layer 104.

However, with this method of forming a via 103 according to prior art, the reference mark 108 formed on the copper foil layer 112 is recognized first and then the via hole 116 is perforated based on this reference mark 108, so that when eccentricity is created during the process of manufacturing the printed circuit board due to differences in the amount of expansion and contraction between the insulation substrate 102 and the insulation layer 104, the via land 110 formed on the insulation substrate 102 is moved in relation to the insulation layer 104, whereby perforating the via hole 116 based on the reference mark 108 formed on the upper surface of the insulation layer 104 causes the via hole 116 to deviate from the via land 110. Afterwards, when plating is performed or conductive paste is filled in the via hole 116 deviating from the via land 110, the via 103 may be formed in an undesirable position, as shown in FIG. 2, or short-circuiting may occur, so that the manufacturing yield may be decreased.

SUMMARY

An aspect of the invention is to provide a printed circuit board and a manufacturing method thereof that prevent the occurrence of short-circuiting between the circuit patterns of the printed circuit board.

Also, another aspect of the invention is to provide an apparatus for perforating via holes which recognizes the reference mark of a printed circuit board to process via holes with precision.

One aspect of the invention provides a method of manufacturing a printed circuit board that includes: forming a first circuit pattern, which includes a reference mark and a via land, on one surface of an insulation substrate; stacking a metal layer on the insulation layer; opening a first window in the metal layer in correspondence with the reference mark; and forming a via which electrically connects the via land with the metal layer, by irradiating light towards the other surface of the insulation substrate and identifying the reference mark through the first window.

The method may further include forming a second circuit pattern by selectively etching the metal layer, after forming the via.

The operation of forming the first circuit pattern may include forming a second window, which corresponds with the reference mark, and a third circuit pattern.

The forming of the via may include: opening a third window in the metal layer in correspondence with the reference mark; perforating a via hole through the third window; and plating the via hole. In this case, perforating the via hole may be performed using a laser drill.

In opening the third window, the third window may be opened to a substantially same diameter as that of the via hole to be perforated.

The insulation substrate and the insulation layer may be made from a light-transmissive material.

The operation of forming the via may include forming the via by identifying the reference mark using a CCD (charge-coupled device) camera.

Another aspect of the invention provides a printed circuit board that includes: an insulation substrate; a reference mark and a first circuit pattern formed on one surface of the insulation substrate; an insulation layer stacked on one surface of the insulation substrate; and a metal layer, which is formed on the insulation layer and which has a first window opened in correspondence with the reference mark.

The printed circuit board described above may further include a second circuit pattern formed by etching the metal layer. Also, a via may further be included which electrically connects the first circuit pattern with the second circuit pattern. In addition, a second window and a third circuit pattern formed on the other surface of the insulation substrate may also be included, where the second window is in correspondence with the reference mark.

The insulation substrate and the insulation layer may be made from a light-transmissive material.

Yet another aspect of the invention provides an apparatus for perforating a via hole on a board, which has a reference mark formed on one surface. The apparatus includes: a stage on which the board is placed such that the other surface of the board faces the stage; a light source which irradiates light towards the other surface of the board; a vision part which identifies the reference mark; and a drill part which perforates the via hole of the board.

The apparatus described above may further include a suction part formed on a surface of the stage which sucks air in.

The light source may include an LED bar, in which multiple LED's are arranged, where the LED bar may be coupled along a side of the stage.

The stage may be made with a light guide plate, and multiple scratches may be formed on a surface of the light guide plate.

The vision part may include a CCD camera, and the drill part may include a laser drill.

Additional aspects and advantages of the present invention will be set forth in part in the description which follows, and in part will be obvious from the description, or may be learned by practice of the invention.

BRIEF DESCRIPTION OF THE DRAWINGS

FIG. 5A and FIG. 5B illustrate a reference mark according to a first disclosed embodiment of the invention.

DETAILED DESCRIPTION

Figure 1:
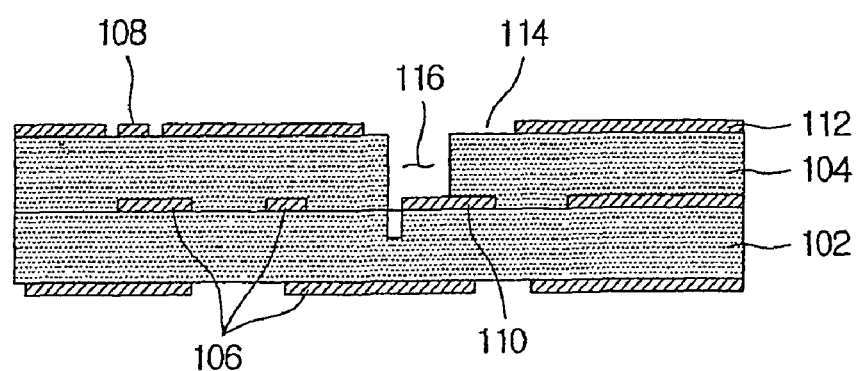
FIG. 1 is a cross-sectional view of a printed circuit board according to prior art.
Figure 2:
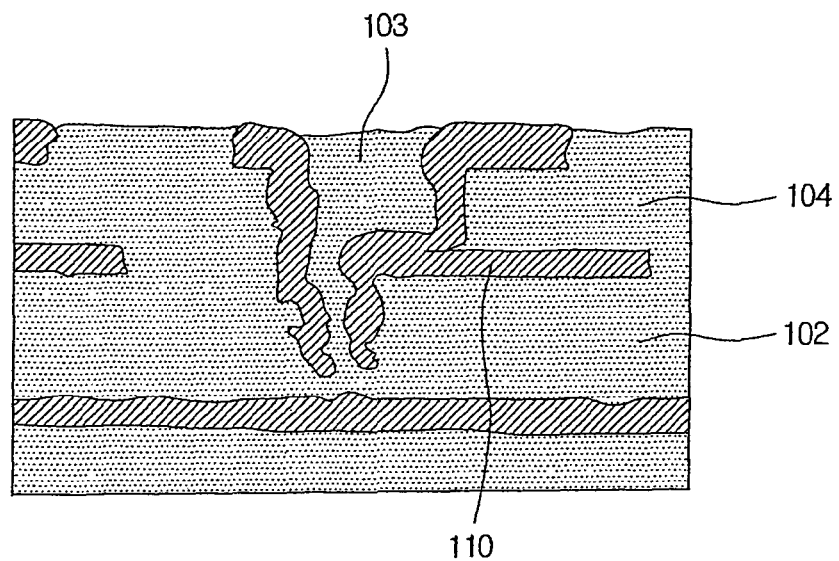
FIG. 2 is a cross-sectional view of a via formed according to prior art.

Embodiments of the invention will be described below in more detail with reference to the accompanying drawings. In the description with reference to the accompanying drawings, those components are rendered the same reference numeral that are the same or are in correspondence regardless of the figure number, and redundant explanations are omitted.

Figure 3:
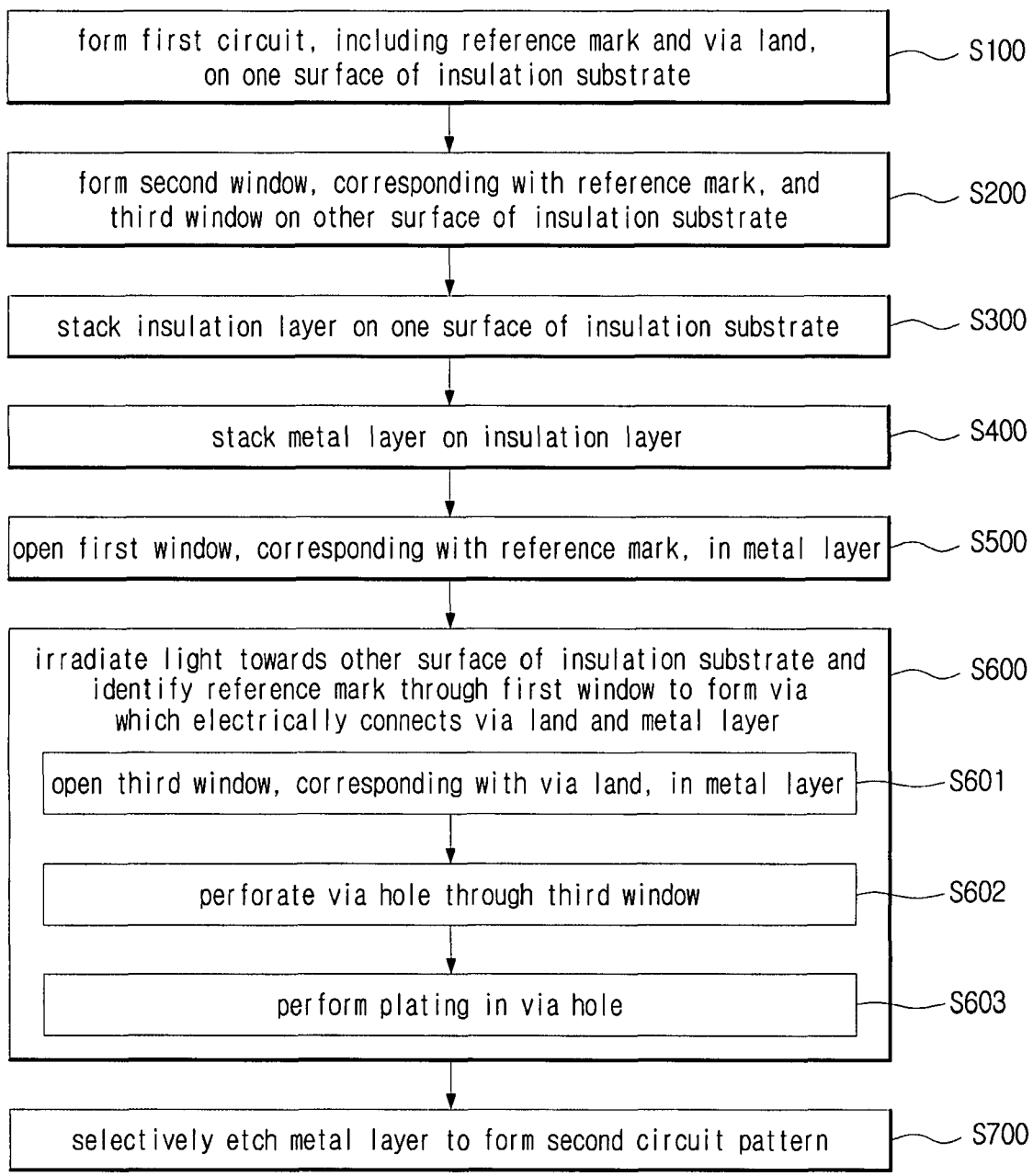
FIG. 3 is a flowchart illustrating a method of manufacturing a printed circuit board according to a first disclosed embodiment of the invention.

FIG. 3 is a flowchart illustrating a method of manufacturing a printed circuit board according to a first disclosed embodiment of the invention, and FIG. 4A, FIG. 4B, FIG. 4C, FIG. 4D, FIG. 4E, FIG. 4F, FIG. 4G and FIG. 4H represent a flow diagram illustrating a method of manufacturing a printed circuit board according to the first disclosed embodiment of the invention. In FIG. 4A to FIG. 4H are illustrated an insulation substrate 12, a reference mark 14, a via land 16, a first circuit pattern 18, an insulation layer 20, a second circuit pattern 22, a first window 24, a via 26, a second window 28, a third circuit pattern 30, a metal layer 34, a third window 36, and a via hole 38.

In this embodiment regarding manufacturing a printed circuit board having a via 26 for electrical interconnection between circuit patterns, even when eccentricity is incurred due to a difference in the amount of expansion and contraction between the insulation substrate 12 and the insulation layer 14, the via hole 38 is perforated after identifying the reference mark 14 formed on the insulation substrate 12. Thus, the via hole 38 may not deviate from the via land 16 of the insulation substrate 12, and by performing plating in such a via hole 38, a via 26 may be formed with precision.

To manufacture a printed circuit board according to this embodiment, firstly, the first circuit pattern 18, which includes a reference mark 14 and a via land 16, may be formed on one surface of the insulation substrate 12 (S100). By forming the reference mark 14 and the via land 16 together on one surface of the insulation substrate 12, later when perforating the via hole 38 to form the via 26 for electrical interconnection between the first circuit pattern 18 and the second circuit pattern 22, the reference mark 14 formed on the insulation substrate 12 may be identified and used as a reference in determining the position of the via land 16 formed on the insulation substrate 12 for perforating the via hole 38. Thus, the via hole 38 may not deviate from the via land 16 and the via 26 may be formed with precision.

The reference mark 14 may be formed, while forming the first circuit pattern 18, as a portion of the circuit pattern 18. It may be possible to form the reference mark 14 as a portion of the circuit pattern in relievo (see FIG. 5A) or in intaglio (see FIG. 5B).

While in this embodiment, the reference mark 14 is formed in a circular shape in relievo, and the window is opened correspondingly in a circular shape larger than that of the reference mark 14, it may also be possible to form the reference mark 14 in a cross shape in relievo or in intaglio, with the window opened in a quadrilateral shape. The reference mark may also have other forms apparent to those skilled in the art.

Figure 4A:
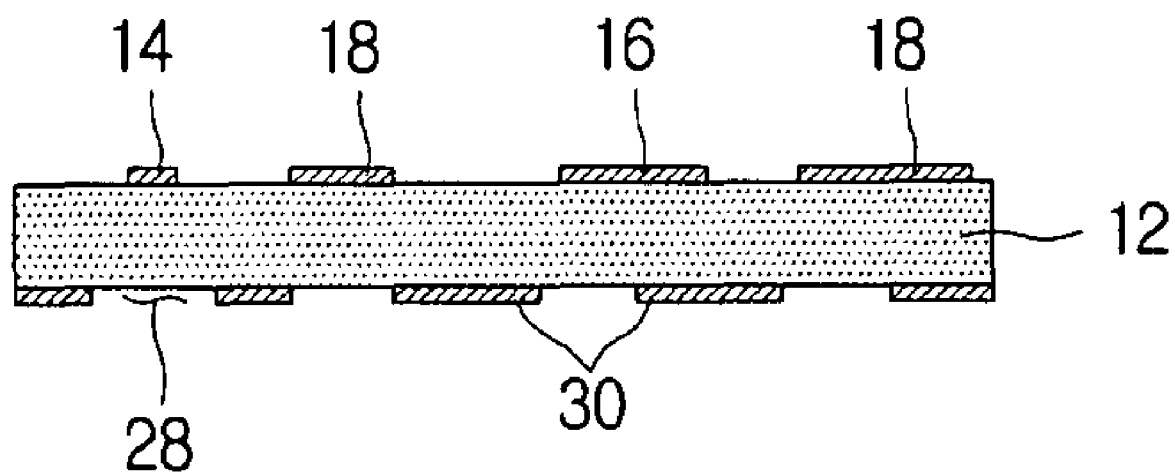
FIG. 4A, FIG. 4B, FIG. 4C, FIG. 4D, FIG. 4E, FIG. 4F, FIG. 4G and FIG. 4H represent a flow diagram illustrating a method of manufacturing a printed circuit board according to the first disclosed embodiment of the invention.

As illustrated in FIG. 4A, a second window 28 corresponding with the reference mark 14 and a third circuit pattern 30 may be formed on the other surface of the insulation substrate 12 (S200). In other words, a circuit pattern may be formed respectively on either surface of the insulation substrate 12, with a second window 28, which is in correspondence with the reference mark 14 formed on one side of the insulation substrate 12, opened on the other surface of the insulation substrate 12. Thus, when irradiating light towards the other surface of the insulation substrate 12 and identifying the reference mark using a CCD camera, etc., as will be described later, the metallic material may be removed, through which it is difficult for light to pass, so that the irradiated light may readily be transmitted through the insulation substrate 12 and insulation layer 20.

Figure 4B:
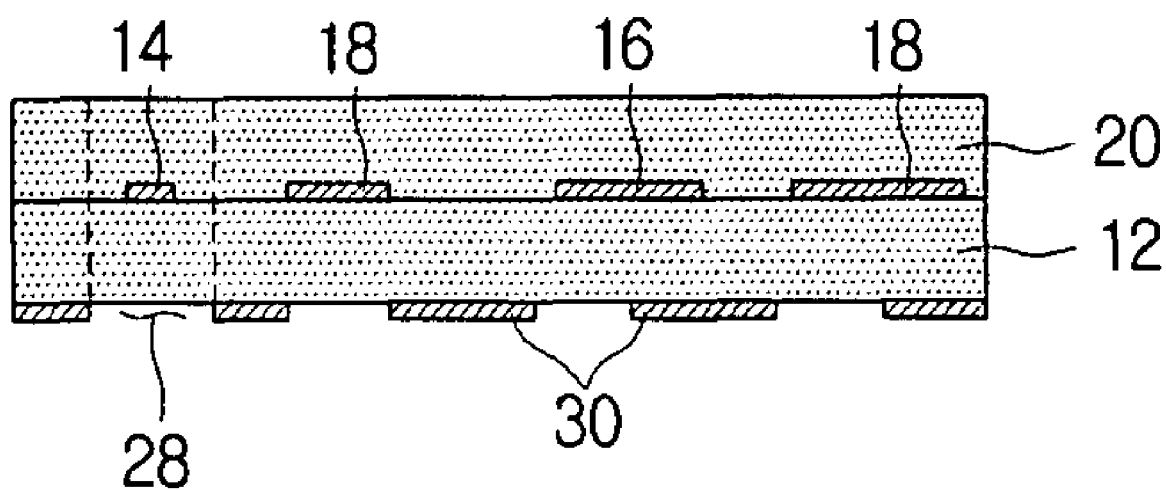

Next, as illustrated in FIG. 4B, the insulation layer 20 may be stacked on one side of the insulation substrate, on which the reference mark 14 and the first circuit pattern 18 have been formed (S300).

Insulating materials such as resin, etc., may be used for the insulation substrate 12, while it may also be possible to use insulating materials such as resin, etc., that include reinforcing materials such as paper, glass fiber, and glass non-wovens, etc., in order to improve mechanical strength or heat resistance.

The insulation layer 20 stacked on one side of the insulation substrate 12 may also use insulating materials. While these insulation layers 20 are typically semi-transmissive to light, the recent trends towards thinner printed circuit boards make it so that when light is irradiated from one side of the insulation substrate 12, the transmitted light may readily be identified from the other side using a CCD camera, etc.

Besides the semi-transmissive material described above, it may also be possible to use fully transparent light-transmissive materials for the insulation substrate 12 and insulation layer 20. In this case, when light is irradiated towards the other surface of the insulation substrate 12, the irradiated light may readily be transmitted through the insulation substrate 12 and insulation layer 20, whereby the reference mark 14 may easily be identified.

Figure 4C:
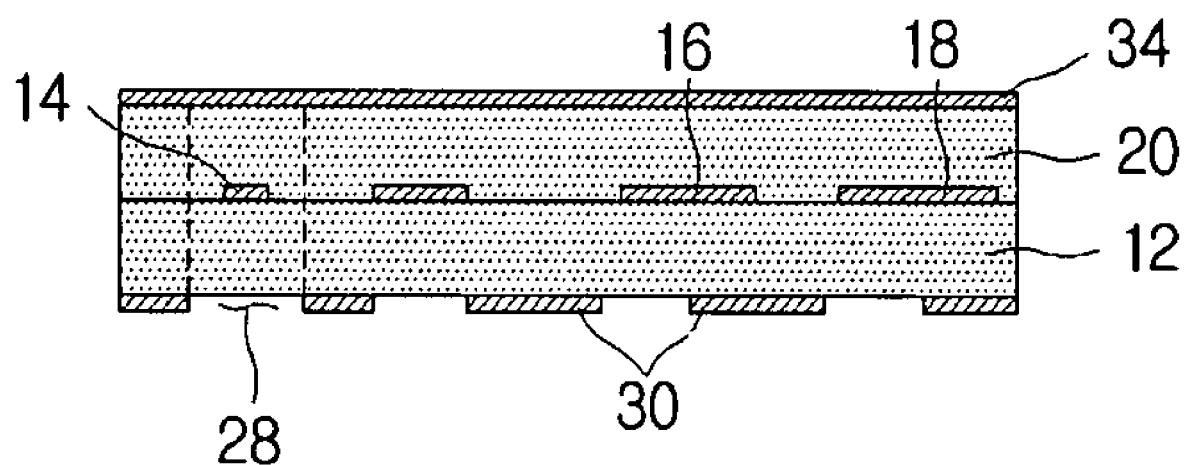

Next, as illustrated in FIG. 4C, the metal layer 34 may be stacked on the insulation layer 20 (S400). The metal layer 34 may later undergo etching to form a circuit pattern, and various conductive materials may be used for the metal layer 34, such as copper (Cu), silver (Ag), gold (Au), and nickel (Ni), etc.

Figure 4D:
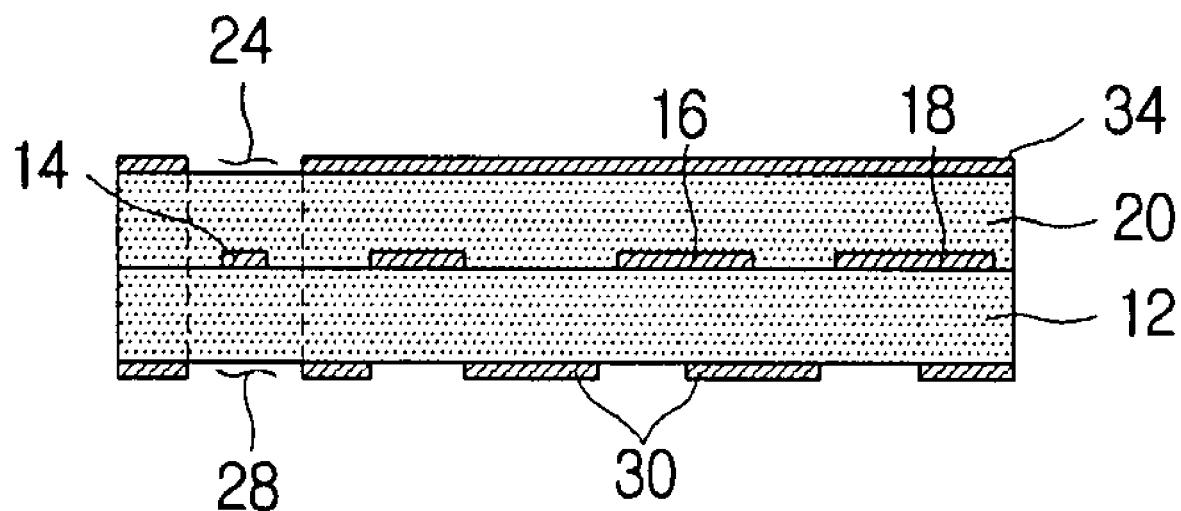

Next, as illustrated in FIG. 4D, the first window 24 in correspondence with the reference mark 14 may be opened in the metal layer 34 (S500). In order to readily identify the reference mark 14 formed on the insulation substrate 12, a portion of the metal layer 34 stacked on the insulation layer 20 may be etched to open the first window 24. Through this window, the reference mark 14 may be identified, which allows an accurate perforation of the via hole 38.

The first window 24 may be opened to a predetermined size in correspondence with the position of the reference mark 14. For example, the reference mark 14 may be formed in a circular shape in relievo or in intaglio, with the window opened above the reference mark 14 in the drawing in the form of circle larger than the reference mark 14. Besides this, it may also be possible that the reference mark 14 have the form of a relievo or intaglio cross, with the window opened in a quadrilateral shape. The reference mark 14 may also have other forms apparent to those skilled in the art.

Next, light may be irradiated towards the other surface of the insulation substrate 12, and the reference mark 14 may be identified through the first window 24 and may be used as a reference for forming a via 26 that electrically connects the via land 16 and the metal layer 34 (S600).

When light is irradiated towards the other surface of the insulation substrate 12 (A light source part may be prepared below the insulation substrate 12 in the drawing to irradiate light towards the other surface of the insulation substrate 12.), the light is transmitted through the insulation substrate 12 and insulation layer 20, which are of transparent materials semi-transmissive or fully transmissive with respect to the light, and the reference mark 14 formed on the insulation substrate 12 may be identified through the first window 24. Thus, even when eccentricity has been generated due to a difference in the rate of thermal expansion, etc., between the insulation substrate 12 and insulation layer 20, since the position of the via land 16 of the insulation substrate 12 may be determined based on the reference mark 14 formed on the insulation substrate 12, a precise via 26 may be formed without short-circuiting between circuit patterns. Here, a CCD camera may be used to more clearly identify the reference mark 14.

Figure 4E:
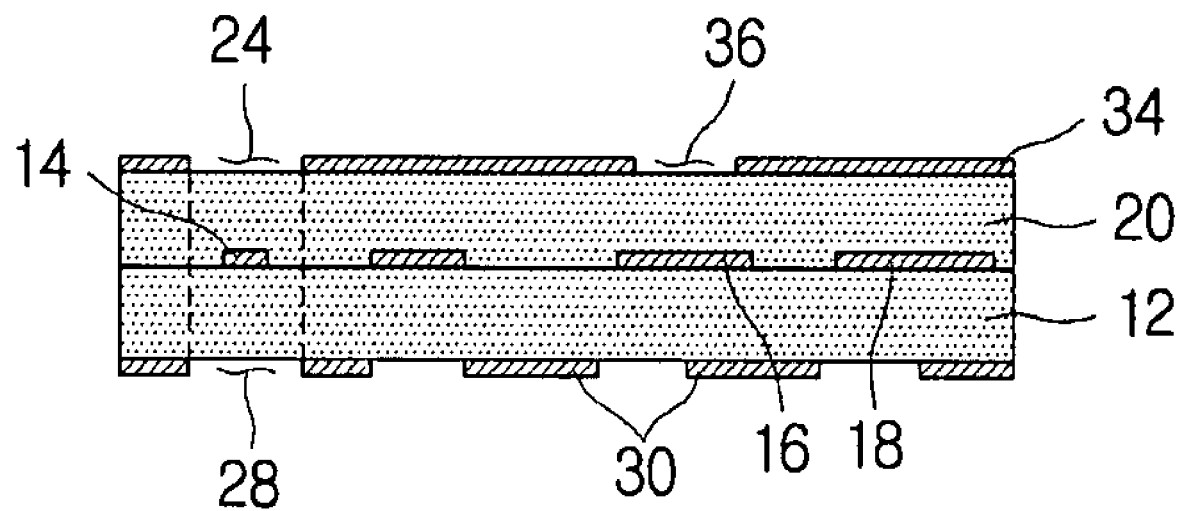

The method of forming the via 26 may include, as illustrated in FIG. 4E, identifying the reference mark 14 on the insulation substrate 12 through the first window 24 and opening a third window 36 in the metal layer 34 based on the reference mark 14 in correspondence with the via land 16 on the insulation substrate 12 (S601).

In this case, the third window 36 may be formed in correspondence with the diameter of the via hole 38 to be formed. That is, the third window 36 may be formed to have a diameter substantially equal to that of the via hole to be perforated. Here, to be substantially equal does not mean complete geometrical equivalence, but rather means that the two are substantially the same in consideration of tolerances in positioning the via land 16 and tolerances in drilling while perforating the via hole 38. While the window for perforating the via hole 38 is typically processed to be larger than the diameter of the via hole 38 in consideration of eccentricity between the insulation substrate 12 and the insulation layer 20, in this embodiment the position of the via land 16 of the insulation substrate 12 may be determined accurately based on the reference mark 14 formed on the insulation substrate 12, even when relative eccentricity has been generated in the insulation substrate 12 and insulation layer 20, so that the diameter of the window 36 may be made to correspond with the diameter of the via hole 38 to be formed.

The method of opening the window may be of selectively etching the metal layer 34 by photolithography or of using a laser drill.

Figure 4F:
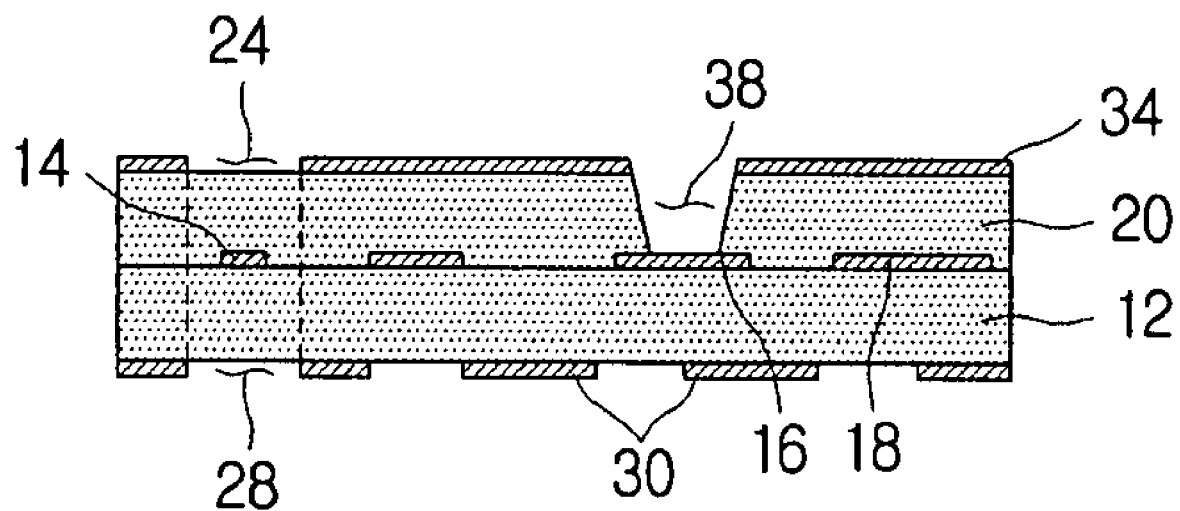

When the window 36 is opened, the via hole 38 may be perforated through the window 36 (S602), as illustrated in FIG. 4F. The via hole 38 may be perforated using a CNC drill or may be perforated using a laser drill.

Figure 4G:
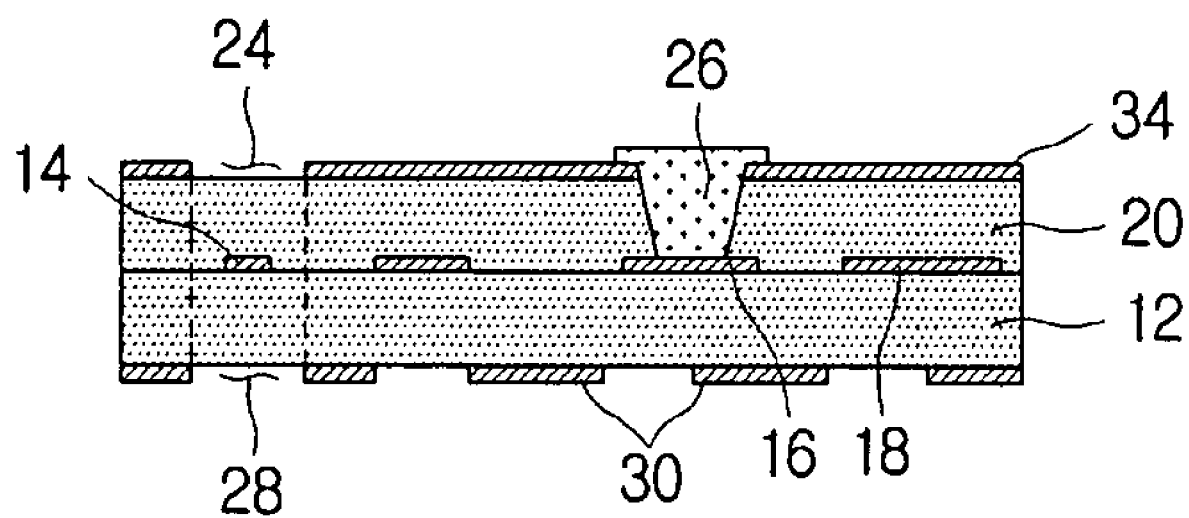

When the via hole 38 is perforated, plating may be performed to electrically connect the via land 16 and the metal layer 34 (S603), as illustrated in FIG. 4G. To do this, electroless plating may first be performed to form a seed layer, after which electroplating may be performed using the seed layer as an electrode. It may also be possible to electrically connect the metal layer 34 and the via land by filling the via hole 38 with conductive paste.

Figure 4H:
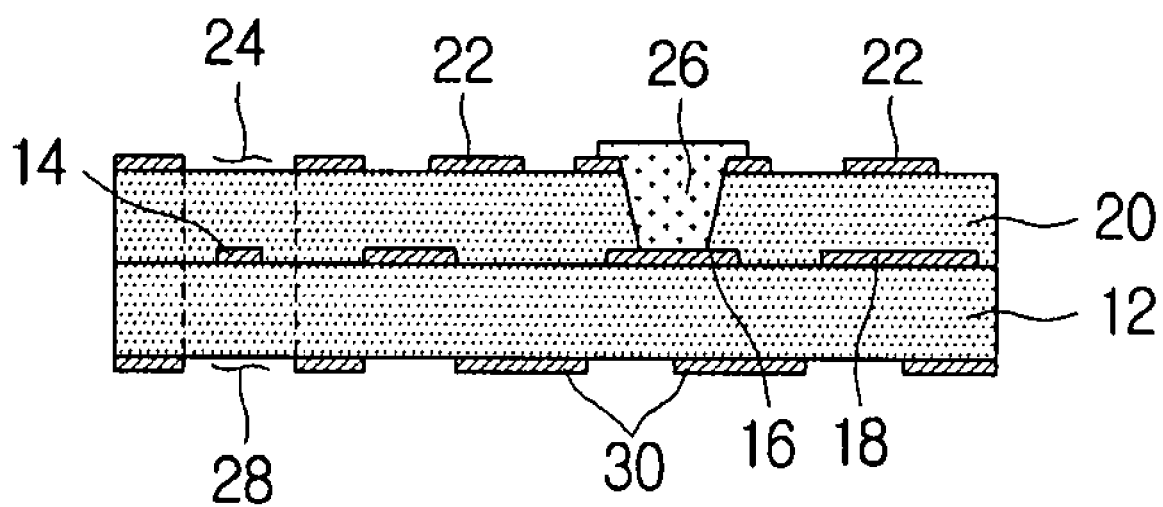

Next, as illustrated in FIG. 4H, when the via land 16 of the insulation substrate 12 and the metal layer 34 formed on the insulation layer 20 are electrically connected by the via 26, the metal layer 34 may be selectively etched to form the second circuit pattern 22 (S700).

Figure 5A:
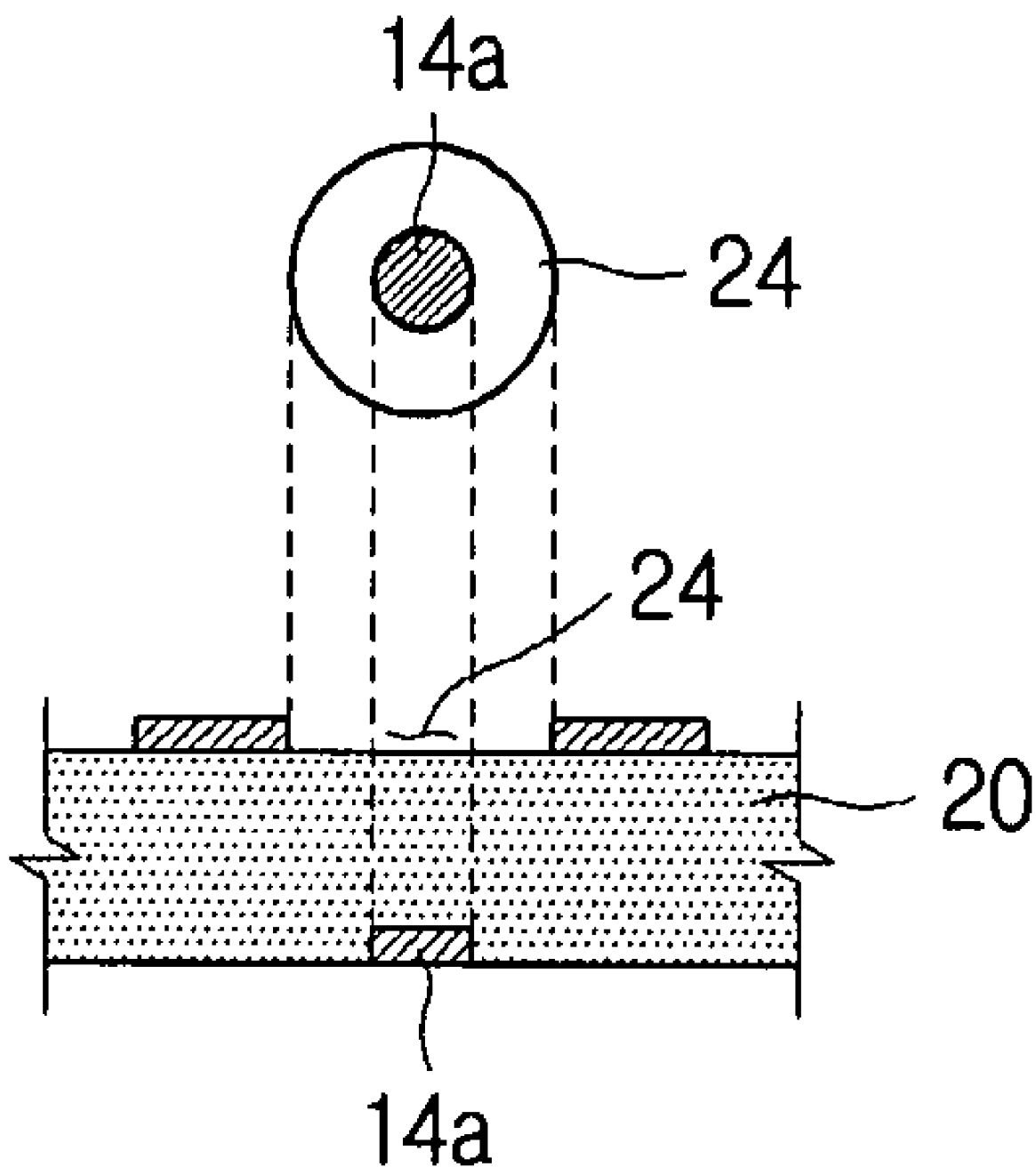

FIG. 5A and FIG. 5B illustrate a reference mark according to a first disclosed embodiment of the invention. In FIG. 5A and FIG. 5B are illustrated reference marks 14a, 14b, and first windows 24.

The drawings in the upper portion of FIG. 5A and FIG. 5B represent reference marks 14a, 14b viewed from above the substrate, while the drawings in the lower portion of FIG. 5A and FIG. 5B represent reference marks 14a, 14b viewed from the side of the substrate.

The reference mark 14a, 14b formed on one surface of the insulation substrate may be formed during the process of forming the first circuit pattern as a portion of the circuit pattern. The insulation layer 20 may be stacked on one surface of the insulation substrate on which the reference mark 14a, 14b is formed, and the metal layer may be stacked on the insulation layer 20, so that in order to identify the reference mark 14a, 14b formed on the insulation substrate, a window 24 may be opened in the metal layer. That is, since a metallic material does not readily allow the transmission of light, a window 24 may be opened in the metal layer so that the reference mark 14a, 14b formed on the insulation substrate may be identified.

The reference mark 14a, 14b, as illustrated in FIG. 5A, may be formed in relievo as a portion of the circuit pattern, or as illustrated in FIG. 5B, may be formed in intaglio by removing portions of the metal layer that form the circuit pattern.

When a window 24 is opened in the metal layer stacked on the insulation layer 20 and light is irradiated towards the other surface of the insulation substrate so that the reference mark 14a, 14b is identified using a CCD camera, etc., on the one surface of the insulation substrate, if the reference mark 14a is formed in relievo, the window 24 portion besides the relievo portion appears brighter because light is transmitted through while the relievo portion appears darker because light is not readily transmitted through, whereas if the reference mark 14b is formed in intaglio, the window 24 portion besides the intaglio portion appears darker because light is not transmitted through while the intaglio portion appears brighter because light is readily transmitted through.

While in this embodiment, the reference mark 14a, 14b is formed in a circular shape in relievo or in intaglio, and the window 24 is opened correspondingly in a circular shape larger than that of the reference mark 14, it may also be possible to form the reference mark in a cross shape in relievo or in intaglio, with the window opened in a quadrilateral shape. The reference mark may also have other forms apparent to those skilled in the art.

Figure 6:
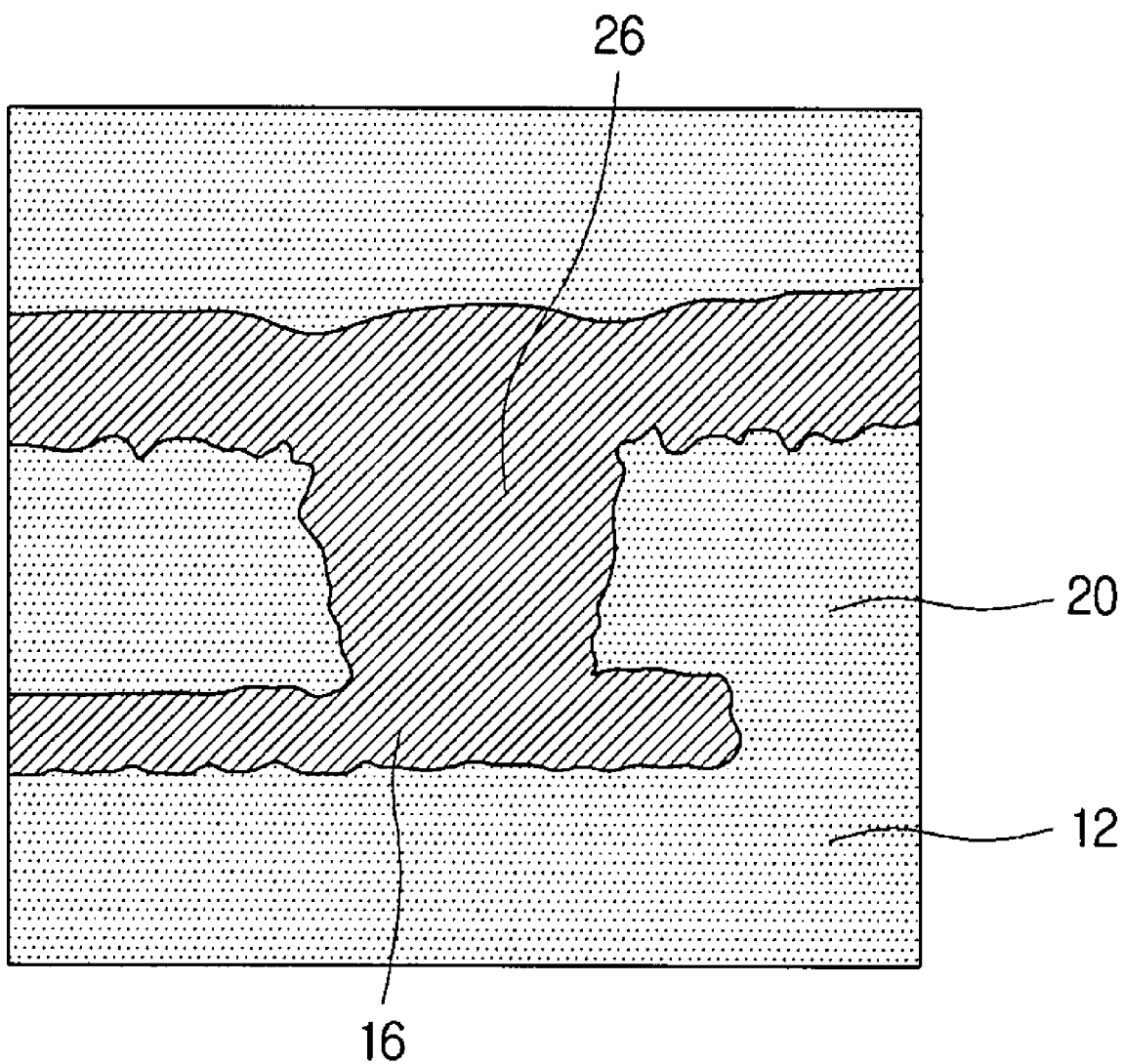
FIG. 6 illustrates a via formed on a printed circuit board according to a first disclosed embodiment of the invention.

FIG. 6 illustrates a via formed on a printed circuit board according to a first disclosed embodiment of the invention. In FIG. 6 are illustrated an insulation substrate 12, an insulation layer 20, a via land 16, and a via 26.

When the window is opened above the via land 16 on the insulation substrate 12 for processing the via hole in the metal layer stacked on the insulation layer 20, and plating is performed in the via hole as described above, the position of the via land 16 of the insulation substrate 12 may be determined based on the reference mark formed on the insulation substrate 12, so that the via hole may be perforated without deviating from the via land 16. Thus, when the plating is performed, a precise via 26 may be formed, as illustrated in FIG. 6.

Figure 7:
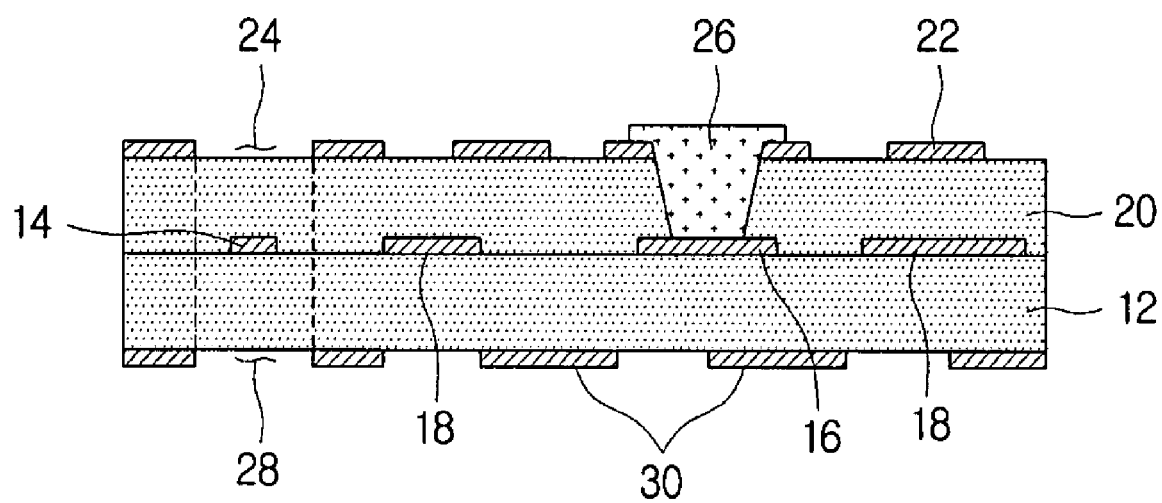
FIG. 7 is a cross-sectional view of a printed circuit board according to a second disclosed embodiment of the invention.

FIG. 7 is a cross-sectional view of a printed circuit board according to a second disclosed embodiment of the invention. In FIG. 7 are illustrated an insulation substrate 12, a reference mark 14, a via land 16, a first circuit pattern 18, an insulation layer 20, a second circuit pattern 22, a first window 24, a via 26, a second window 28, and a third circuit pattern 30.

A printed circuit board based on an aspect of the invention may be composed mainly of an insulation substrate 12, a reference mark 14 and a first circuit pattern 18 formed on one surface of the insulation substrate 12, an insulation layer 20 stacked on the one surface of the insulation substrate 12 on which the first circuit pattern 18 is formed, and a metal layer 34 which is formed on the insulation layer 20 and in which a first window 24 corresponding with the reference mark 14 is opened. Thus, the reference mark 14 of the inner layer may be identified through the first window 24 to form the via hole 38 in the insulation layer 20 in a position corresponding with the via land 16 of the inner layer, so that even when there is eccentricity created due to different rates of thermal expansion in the insulation substrate 12 and the insulation layer 20, it is possible to perforate the via hole 38 in the correct position. In this case, in order to identify the reference mark 14 formed on the insulation substrate 12 using a CCD camera, etc., light may be irradiated towards the other surface of the insulation substrate 12, at which the irradiated light may be transmitted through the insulation substrate 12 and insulation layer and through the first window 24, so that the reference mark 14 may readily be identified.

After forming the via 26, the metal layer 34 stacked on the insulation layer 20 may be selectively etched by photolithography, etc., to form the second circuit pattern 22.

A printed circuit board based on this embodiment may include a via 26 for electrical interconnection between the first circuit pattern 18 formed on one surface of the insulation substrate 12 and the second circuit pattern 22 formed as the metal layer 34 formed on the insulation layer 20 is selectively etched.

A method of forming the via 26 may include, first, irradiating light towards the other surface of the insulation substrate 12, identifying the reference mark 14 through the opened first window 24 using a CCD camera, etc., and perforating the via hole 38 in a position corresponding with the via land 16 formed on the insulation substrate 12 using the reference mark 14 as a reference. In this case, even when eccentricity has occurred due to the relative expansion and contraction between the insulation substrate 12 and the insulation layer 20, the position of the via land 16 formed on the insulation substrate 12 may be determined based on the reference mark 14 formed on the insulation substrate 12, so that it is possible to perforate the via hole 38 with greater accuracy. By performing plating in such a via hole 38 or by filling the via hole 38 with conductive paste, a via 26 may be formed for electrical interconnection between the first circuit pattern 18 and the second circuit pattern 22.

Furthermore, on the other surface of the insulation substrate 12, a second window 28 may be formed, which is in correspondence with the reference mark 14, and a third circuit pattern 30 may be formed. In other words, the reference mark 14 and a first circuit pattern 18 may be formed on one surface of the insulation substrate 12, while a second window 28 that is in correspondence with the reference mark 14 and a third circuit pattern 30 may be formed on the other surface of the insulation substrate 12, to form a printed circuit board having a total of three layers.

Moreover, multiple metal layers 34 and insulation layers 20 may alternately be formed on the other surface of the insulation substrate 12, and each of the metal layers 34 may have a window opened that is in correspondence with the reference mark 14. That is, even when multiple metal layers 34 are stacked, the reference mark 14 may be identified by forming windows corresponding with the reference mark 14 on the multiple metal layers 34.

Insulating materials such as resin, etc., may be used for the insulation substrate 12 and insulation layer 20, while it may also be possible to use insulating materials such as resin, etc., that include reinforcing materials such as paper, glass fiber, and glass non-wovens, etc., in order to improve mechanical strength or heat resistance. While the insulation substrate 12 and insulation layer 20 are typically semi-transmissive to light, the recent trends towards thinner printed circuit boards make it so that when light is irradiated from one side of the insulation substrate 12, the transmitted light may be identified from the other side.

Besides the semi-transmissive material described above, it may also be possible to use fully transparent light-transmissive materials for the insulation substrate 12 and insulation layer 20. In this case, when light is irradiated towards the other surface of the insulation substrate 12, the reference mark 14 may readily be identified.

The insulation layer 20 stacked on one side of the insulation substrate 12 may also use insulating materials. Also, prepreg may be used for the insulation layer 20. Prepreg is made by impregnating glass fiber with a thermosetting resin to form a semi-cured state, and prepreg may be employed for the insulation layer 20 in the form of sheets.

Figure 8:
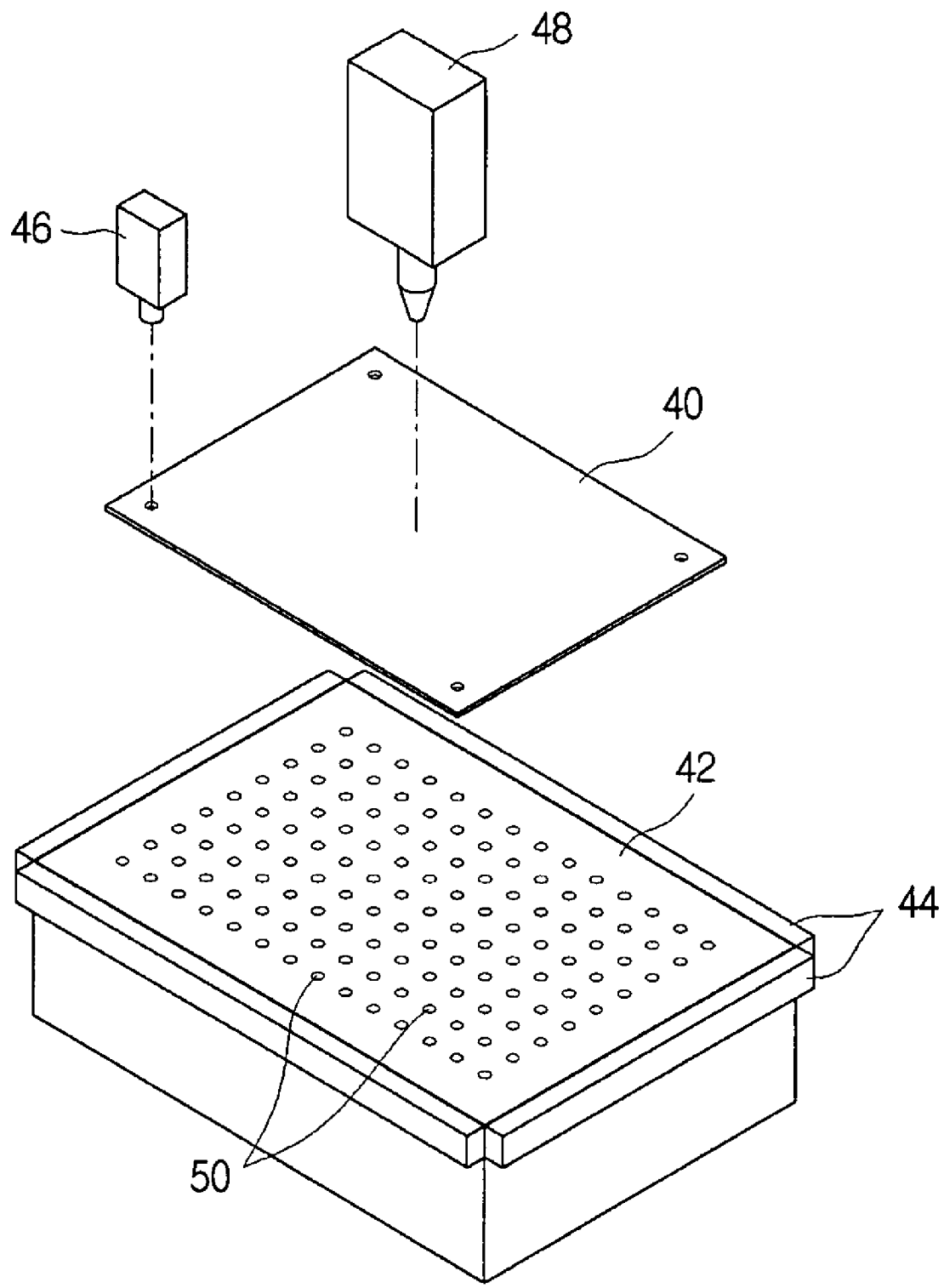
FIG. 8 is a perspective view of an apparatus for perforating via holes according to a third disclosed embodiment of the invention.

FIG. 8 is a perspective view of an apparatus for perforating via holes according to a third disclosed embodiment of the invention. In FIG. 8 are illustrated a board 40, a stage 42, LED bars 44, a vision part 46, a drill part 48, and a suction part 50.

A via hole perforation apparatus based on this embodiment is an apparatus for perforating a via hole in manufacturing a printed circuit board, and may recognize a reference mark on the board to process the via hole with precision.

A via hole perforation apparatus of this embodiment, may be composed mainly of a stage 42, on which the board is placed such that the other surface of the board faces the stage 42, a light source part which irradiates light towards the other surface of the board, a vision part 46 which identifies the reference mark, and a drill part 48 which perforates the via hole of the board. Thus, a via hole may be perforated in the board with greater precision.

The stage 42 is where the board may be placed. A suction part 50 may be equipped on the surface of the stage 42 which sucks in air during the perforation of the via hole, in order to prevent the board 40 from moving. When the board is placed for perforating a via hole, the suction part 50 may secure the board 40 by suction. The suction part 50 may be connected in terms of airflow with vacuum valves (not shown), such that when the board 40 is placed on the stage 42, the board 40 may be secured by drawing in air through the vacuum valves to create a vacuum in the space formed by the suction part 50 and the board. The suction part 50 may be in the form of multiple circular grooves formed in the surface of the stage 42. However, besides forming multiple circular grooves, it may also be possible to form the suction part 50 in lines by forming linear grooves.

In order that the light from the light source part may be irradiated uniformly onto the board 40, a light guide plate may be used for the stage 42. Also, multiple scratches may be formed on the surface of the light guide plate to disperse the irradiated light, so that the light is irradiated uniformly onto the board.

The light source part may irradiate light towards the other surface of the board. The light may be irradiated so that the reference mark formed on one surface of the board 40 may readily be identified, and when board 40 is placed such that the other surface faces the stage 42, the light source part irradiates light towards the other surface of the board 40, at which the reference mark may be identified using the vision part 46 described later.

The light source part may include LED bars 44, in which multiple LED's are arranged, and light may be irradiated towards the other surface of the board 40 with the LED bars 44 coupled along the sides of the stage 42. In this case, a light guide plate may be used in order that the light from the LED bars 44 arranged on the sides of the stage 42 may be irradiated uniformly, and multiple scratches (not shown) may be formed on such a light guide plate. The multiple scratches may disperse the light irradiated through the light guide plate, so that the light may be irradiated more evenly onto the board 40.

It is also possible to irradiate light towards the other surface of the board 40 with a backlight arranged below the stage 42 in the drawing.

The vision part 46 may be a device which identifies the reference mark formed on the board, and the vision part 46 may include a CCD camera. In addition, a display may also be included which shows the image photographed by the CCD camera.

The reference mark 14 may be identified from the image photographed by the CCD camera of the vision part 46, and may be used as a reference in determining the position of the window and the position of the via land, etc., for perforating the via hole.

When the reference mark of the board 40 is identified through the vision part 46, the drill part 48 may use the reference mark as reference to open a window necessary for perforating the via hole, or for perforating the via hole itself through the opened window.

The drill part 48 may include a CNC drill or a laser drill; this embodiment shows a laser drill being used. A carbon dioxide laser, YAG laser, etc., may be used for the laser drill.

As set forth above, according to certain aspects of the invention, the occurrence of short-circuiting is prevented in forming vias for electrical interconnection between circuit patterns in a printed circuit board, and as the defect rate caused by eccentricity between insulation layers may be reduced, aspects of the invention may contribute to reducing costs.

Also, a via hole may be perforated with precision, as the reference mark of a printed circuit board may be recognized with greater ease, so that the via holes may be processed with greater precision.

While the present invention has been described with reference to particular embodiments, it is to be appreciated that various changes and modifications may be made by those skilled in the art without departing from the spirit and scope of the present invention, as defined by the appended claims and their equivalents.

What is claimed is:

1. An apparatus to perforate a via hole on a board having a reference mark formed on a first surface thereof, the apparatus comprising:
    a stage, comprising a light guide plate, configured to have the board placed thereon such that a second surface of the board faces the stage;
    a light source configured to irradiate light towards the second surface of the board;
    a vision part configured to identify the reference mark; and
    a drill part configured to perforate the via hole of the board.

2. The apparatus of claim 1, further comprising a suction part formed on a surface of the stage and configured to suck air.

3. The apparatus of claim 1, wherein the light source comprises an LED bar, the LED bar having multiple LED's arranged therein, and wherein
    the LED bar is coupled along a side of the stage.

4. The apparatus of claim 1, wherein multiple scratches are formed on a surface of the light guide plate.

5. The apparatus of claim 1, wherein the vision part comprises a CCD camera.

6. The apparatus of claim 1, wherein the drill part comprises a laser drill.

* * * * *